United States Patent [19]
Chen et al.

[11] Patent Number: 5,156,710
[45] Date of Patent: Oct. 20, 1992

[54] METHOD OF LAMINATING POLYIMIDE TO THIN SHEET METAL

[75] Inventors: Pei C. Chen, Endicott; Thomas E. Kindl, Endwell; Paul G. Rickerl, Endicott; Mark J. Schadt, Vestal, all of N.Y.; John G. Stephanie, Rochester, Minn.

[73] Assignee: International Business Machines Corporation, Armonk, N.Y.

[21] Appl. No.: 695,850

[22] Filed: May 6, 1991

[51] Int. Cl.⁵ .............................................. B32B 31/00
[52] U.S. Cl. .................................. 156/273.3; 156/286; 156/307.5; 156/311; 156/312; 156/315; 156/331.5; 428/420; 428/458; 522/164
[58] Field of Search ............... 156/286, 312, 311, 315, 156/273.3, 307.5, 331.5; 428/420, 458; 522/164

[56] References Cited

U.S. PATENT DOCUMENTS

| | | |
|---|---|---|
| 3,607,387 | 9/1971 | Lanza et al. |
| 4,411,952 | 10/1983 | Sasaki et al. |
| 4,503,285 | 3/1985 | Dorms et al. |
| 4,517,254 | 5/1985 | Grapentin et al. |
| 4,543,295 | 9/1985 | St. Clair et al. |
| 4,675,246 | 6/1987 | Kundinger et al. ............ 428/458 |
| 4,681,654 | 7/1987 | Clementi et al. |
| 4,761,699 | 8/1988 | Ainslie et al. |
| 4,789,914 | 12/1988 | Ainslie et al. |
| 4,858,073 | 8/1989 | Gregory |
| 4,868,071 | 9/1989 | Walsh et al. |
| 4,883,718 | 11/1989 | Ohta et al. |
| 4,906,803 | 3/1990 | Albrechta et al. |
| 4,931,310 | 6/1990 | Anschel et al. |
| 4,939,039 | 7/1990 | Watanabe |
| 4,996,623 | 2/1991 | Erpelding et al. |

OTHER PUBLICATIONS

IBM Technical Disclosure Bulletin, vol. 31, No. 11, Apr. 1989, pp. 32-33.

*Primary Examiner*—John J. Gallagher
*Attorney, Agent, or Firm*—Lawrence R. Fraley

[57] ABSTRACT

An improved method of laminating a metal foil or sheet to a polyimide material is provided. A solution of a precursor of an intractable (i.e. thermosetting) polyimide is applied to a substrate and the solvent is removed to form a dry tack-free film. Thereafter, a solution of a precursor of a thermoplastic polyimide is applied onto the first film of polyimide and the solvent is removed to form a dry tack-free second film. Both films are then cured concomitantly at a sufficiently rapid rate and low temperature to effect substantial imidization of the polyimide precursors of both films without substantial crosslinking or densification of the polyimides in either of the films. Thereafter, a metal sheet or foil is laminated onto the thermoplastic polyimide film according to the following process. The thermoplastic film is contacted with the sheet or foil of metal to be laminated thereto. A first pressure is applied to the metal sheet and the polyimide substrate composite, which pressure is sufficiently low to permit outgassing of any gases trapped or generated within the polyimides and the temperature is increased. The temperature is raised to a level to essentially complete imidization of the polyimides and also to expel any gases contained or generated by said polyimide films. Thereafter, the pressure is increased to a second level or value and the temperature is controlled to a value which temperature is above the $T_g$ of the thermoplastic film. This second pressure is sufficiently high to complete the lamination of the metal sheet or foil to the thermoplastic polyimide.

28 Claims, 1 Drawing Sheet

METHOD OF LAMINATING POLYIMIDE TO THIN SHEET METAL

FIELD OF THE INVENTION

This invention relates generally to laminating of polyimide materials to metal sheets, and more particularly to an improved method of laminating thin sheets of metal to a dual layer of polyimide cast on a metal substrate. In still other aspects, this invention relates to an improved method of curing, i.e. imidizing thermoplastic polyimides.

BACKGROUND OF THE INVENTION

Laminates comprising one or more layers of polyimide and one or more layers of substrate materials such as metals and alloys may be used for a variety of applications. These applications include structures which provide both structural integrity as well as electrical circuitry such as in circuit boards or the like, and many other uses. When laminates are to be used for current carrying applications, such as circuit boards or the like, the metal substrates are selected because of their mechanical properties, as well as their electrical and/or magnetic properties. At least one of the metal substrates typically is copper or a copper alloy because of the high conductivity of copper and its alloys. The polyimide layer or layers are selected because of their dielectric properties.

There are many prior art processes for laminating polyimides to various types of metal sheets or foils. U.S. Pat. No. 4,675,246 to Kundinger, et al. describes various different types of laminate configurations used in different types of polyimides and different metal substrates. However, this patent discloses only conventional curing techniques for curing the polyimide materials. Additionally, U.S. Pat. No. 3,607,387 to Lanza, et al. discloses a thermoplastic polyimide used in contact with a wire conductor such that the circumference is encased. The thermoplastic polyimide is then encased with an intractable polyimide. This reference does not teach a process for lamination of sheets, only a process for dip coating or extrusion coating of wire.

U.S. Pat. No. 4,411,952 to Sasaki et al. describes the use of specific polyimides formed from reaction of 3, 3', 4, 4'- or 2, 3, 3', 4'- biphenyl tetracarboxylic acids having any one of a variety of diamine bridging units. These precursors are coated and then fully imidized to form a sheet which imidized sheet is then laminated to a conductor foil by conventional heat/pressure processes.

U.S. Pat. No. 4,503,285 to Darms, et al. discloses the use of polyamide/polyamide acid copolymers and block copolymers as useful precursor solutions for obtaining polyamide/polyimide composite films with high adhesion to metal foils. The polyamide/polyamide acids are coated onto a conducting foil and cured in situ. The foil is then photopatterned and etched. The curing is conventional and forms a polyamide/polyimide film.

U.S. Pat. No. 4,543,295 to St. Clair et al. discloses the use of fully imidized thermoplastic polyimide films placed between metal foils, and the use of thermoplastic polyamic acid, applied to the fully imidized polyimides or metal foils to act as a thermoplastic adhesive. While this patent discloses the use of linear aromatic polyamic acids and polyimides as adhesives, it stresses only the importance of adequate thermal treatments to minimize outgassing during lamination processing. Apparently there is no attempt to minimize thermally initiated interchain crosslinkage or polyimide densification during either polyimide curing or lamination processing.

U.S. Pat. No. 4,681,654 to Clementi, et al. discloses a method for making a polyimide based chip carrier by application of either a polyamic acid or, a fully imidized polyimide solution onto a metal carrier. The polyimide film is then cured by either thermally induced imidization in the case of the polyamic acid film, or by simple solvent evaporation in the case of the preimidized film, so that the metal carrier can be removed to allow a thin free-standing polyimide film to be formed. This free standing polyimide film can be bonded to a support frame or roll carrier for further processing with the use of an adhesive. This adhesive is comprised of either a polyimide, acrylic, or epoxy resin.

U.S. Pat. No. 4,883,718 to Ohta, et al. teaches the use of specific classes of polyimides as thermoplastic adhesives for obtaining high adhesion forces to metal foils.

U.S. Pat. No. 4,939,039 to Watanabe teaches the synthesis of polyimides having low thermal expansion coefficient for direct coating and curing on metal conductors.

U.S. Pat. No. 4,931,310 to Anschel, et al. discloses a technique for treating the surface of an intractable polyimide to form polyamic acid, which is then rapidly converted to polyimides by IR radiation. No techniques for lamination is disclosed nor is any technique for selectively imidizing thermoplastic polyamic acid.

IBM Technical Disclosure Bulletin, Vol. 31, No. 11, Apr. 1989, pp. 32–33 discloses a technique for imidizing an intractable polyimide to prevent the formation of skin by IR radiation. No lamination technique is disclosed nor any selective imidization of thermoplastic polyimides.

Whatever technique or materials are used in forming a lamination between a polyimide material and a metal foil, it is necessary to have a solid continuous high strength adherent bond between the polyimide material and the metal laminates so as to provide the necessary structural integrity to any parts formed therefrom thus assuring that the parts will not delaminate. Structural integrity is especially critical in certain applications where the laminated structure serves both as a current carrying member and also as a structural member.

A conventional prior technique for bonding laminates such as those described in certain of the above cited patents includes applying a first film of thermosetting or intractable polyimide precursor to a metal substrate and thermally imidizing the interactable polyimide. A second layer of thermoplastic polyimide precursor is coated over the intractable polyimide and thermally imidized. The dual layer polyimide on the metal substrate is then laminated to a metal foil such as copper. It has been found, however, that the use of conventional oven curing (thermal) techniques and lamination processes produce laminates with insufficient bond strength between the laminated metal and the thermoplastic polyimide. The reasons for such low bond strength and poor lamination properties are not completely understood. However, in the prior art it was believed due, at least in part, to gas being trapped between the thermoplastic polyimide and the sheet metal being laminated thereto thus preventing good adhesion, and in some instances, resulting in significantly large (i.e. macro) areas of interface which are not bonded at all due to entrapped gases.

SUMMARY OF THE INVENTION

According to the present invention an improved method of laminating a metal foil or sheet to a polyimide material is provided. In one embodiment, a solution of a precursor of an intractable (i.e. thermosetting) polyimide is applied to a substrate and the solvent is removed to form a dry tack-free film.

Thereafter, a solution of a precursor of a thermoplastic polyimide is applied onto the first film of polyimide and the solvent is removed to form a dry tack-free second film. Both films are then cured concomitantly at a sufficiently rapid rate to effect near complete imidization of the polyimide precursors of both films without substantial crosslinking or densification of the polyimides in either of the films. This is preferably accomplished by using IR radiation in the 2.82-3.28 micron range, while maintaining the material at 250° C. or less to prevent crosslinking and other phenomena which could raise the glass transition temperature ($T_g$) of the thermoplastic polyimide, yet promote imidization. In addition, interdiffusion of polyimide chains at the intractable polyimide/thermoplastic polyimide interface occurs giving rise to a strongly adhesive polyimide/polyimide interfacial zone without the need for additional adhesion promoting techniques.

Thereafter, a metal sheet or foil is laminated onto the thermoplastic polyimide film according to the following process: The thermoplastic film is contacted with the sheet or foil of metal to be laminated thereto. A first pressure is applied to the metal sheet and the polyimide substrate composite, which pressure is sufficiently low to permit outgassing of any gases trapped or generated within the polyimides. A vacuum may also be applied to promote outgassing of entrapped species. Thereafter the laminating temperature applied to the polyimides and metal sheet is increased while maintaining the first pressure. The temperature is raised to a level to essentially complete imidization of the polyimides and also to expel any gases contained or generated by said polyimide films. A small amount of crosslinking and densification of the polyimides in both films, both within each film and between the films, will occur during this step and is unavoidable. Thereafter, the pressure is increased to a second level or value and the temperature is controlled to a value which temperature is above the $T_g$ of the thermoplastic film. This will typically be a higher temperature than the first temperature level. This second pressure is sufficiently high to complete the lamination of the metal sheet or foil to the thermoplastic polyimide. Following this, the pressure is maintained until the laminating composite is cooled to below the $T_g$ of the thermoplastic polyimide. The resulting structure will be a polyimide core interposed between and bonded to the metal substrates.

In another embodiment, the layer of intractable polyimide can be omitted and the thermoplastic polyimide precursor can be applied directly to a substrate.

DESCRIPTION OF THE PREFERRED EMBODIMENT

Figure 1:
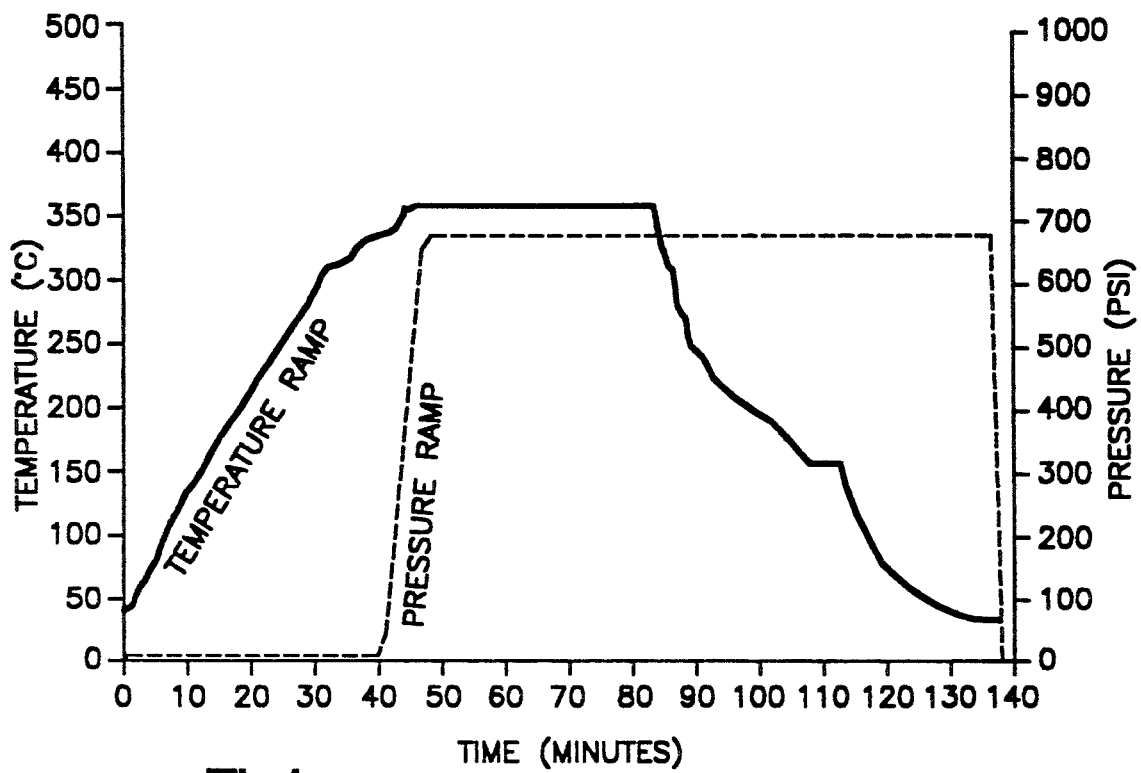
FIG. 1 is a graph showing the temperature and pressure transits during the lamination portion of the present invention; and, FIG. 2 is a cross-sectional view somewhat schematic, of a laminate formed according to this invention.

According to the present invention, an improved method of forming a structure of a single or multilayer polyimide formed on a substrate with a copper alloy foil, or other metal sheet laminated thereto is provided, as well as an improved method of curing the thermoplastic polyimide used therein. The present method reduces or eliminates previous problems encountered during conventional laminating processes which in the past resulted in poor adhesion and indeed significant areas of nonlaminating or nonbonding between the copper foil and the polyimide layer. The present invention will be described as it is practiced in conjunction specifically with laminating a thin foil of copper alloy onto a dual layer of polyimides, i.e. thermoplastic polyimide and an intractable polyimide which dual layer is bonded onto a stainless steel substrate. It should be understood however that the process is not so limited to these particular materials but rather it is applicable to the lamination of sheets of various types of metals and materials onto polyimides as will be readily recognized by those skilled in the art.

A substrate of a sheet of 0.003 inch thick AISI type 302 stainless steel is provided. Onto this sheet of stainless steel is coated a solution of the precursor of an intractable polyimide. An example of one such preferred intractable polyimide is poly(4, 4'-oxydiphenylene benzene -1, 2, 4, 5-tetracarboxylicdiimide) PMDA-ODA, the precursor polyamic acid solution being available from various commercial sources such as E.I. DuPont de Nemours Co. having a place of business in Wilmington, Delaware 19898, as Pyralin ® PI-5878 or Pyralin ® PI-2540. PMDA-ODA is an intractable or thermosetting polyimide in that when it is fully imidized, it does not present a well-defined glass transition ($T_g$) temperature and is insoluble in phenolic solvents. The intractable precursor PMDA-ODA polyamic acid is applied to such a thickness that the resulting film thickness after drying and curing will be about (but not limited to) 4 microns. Following the coating of the PMDA-ODA onto the substrate, it is heated to a sufficient temperature and for a sufficient amount of time to drive off a major portion of the solvent but not to cause any significant imidization or densification of the material. Heating to 85° C. for 15 minutes for the preferred 4 micron thick film will normally be sufficient to cause the removal of the solvents so that the PMDA-ODA dries to an essentially dry, tack-free film adhering to the stainless steel.

Following this formation of a dry tack-free film, a solution of a precursor of a thermoplastic polyimide is coated over the intractable polyimide film. A preferred type of thermoplastic polyimide is DuPont Pyralin ® PI-2566 poly(4,4'-oxydiphenylene 1,1'-hexafluoropropyldiphenylene 3,3'4,4'-tetracarboximide) 6FPDA-ODA. This is applied to a sufficient thickness such that when the film is dried and cured it will have a thickness of (but not limited to) about 2 microns. This second coating is also dried to remove a major portion of the solvent to produce a dry tack-free essentially nonimidized film. This drying preferably can take place at about 85° C. for about 15 minutes. It will be understood that the two polyimide precursors are both supplied as organic solutions. Depending upon the method chosen for coating, the desired film thickness, and other parameters, the solution viscosity can be altered by the addition of solvent as needed.

At this point in the processing, there is a stainless steel substrate having a first layer of intractable polyimide precursor adhering thereto and a second film of a thermoplastic polyimide film over the intractable polyimide precursor film.

The two polyimide precursor films are then subject to a curing process which will rapidly imidize the polyimides of both layers without causing substantial crosslinking. The terms "imidization" and "curing" of polyimides as used herein are synonymous and describe the chemical reaction which forms polyimides from polyamides. When polyamic acids are the beginning polyamide, water is liberated during imidization. When ethyl esters of polyamic acids are the beginning polyamide, ethanol is liberated during imidization. This is preferably performed by exposing the film to infrared radiation (IR) in the near infrared region (i.e. a wavelength of about 2-3 microns) while heating the films to about 250° C. The process takes place in an oven heated by infrared radiation which has the temperature controlled to 250° C. The IR radiation not only heats the furnace and promotes outgassing of the polymer but also significantly increases the rate of reaction for imidizing the polyimide precursors, without inducing any significant crosslinking and densification. Interchain polyimide crosslinking is known to result from thermal input. Interchain imidization between neighboring chain polyamic acids may occur during polyimide curing. Because long thermal cure processes at high temperature are required for full imidization, much more solvent is removed prior to forming a completely imidized film. Solvent removal places neighboring chains in closer proximity and increases the probability of transimide formation. In fully cured polyimide films, thermally activated C-N bond-breaking within the imide functionality gives rise to nitric radicals. These radicals, when produced on neighboring polyimide chains can react to produce interchain transimides. Because this process is thermally activated, increasing thermal treatment (time and/or temperature) will result in some increase in transimide polyimide. In the case of thermoplastic polyimides this results in increasing polyimide $T_g$. This reaction rapidly increases in rate at $T > 250°$ C., although large amounts of transimides are not believed to be formed since reimidization to the original polyimide is strongly favored for steric reasons.

A more detrimental phenomenon (from the standpoint of raising the $T_g$) is thermally activated interchain crosslinking which can also occur through the $R_1$ bridging portion of the monomer for thermoplastic polyimides of the form:

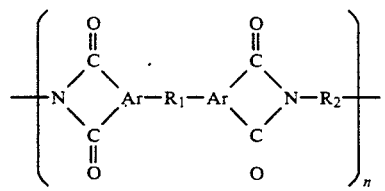

where

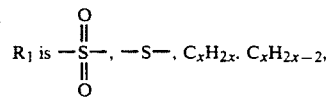

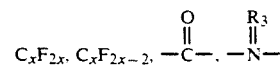

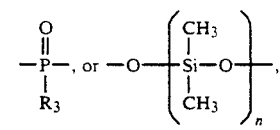

or i.e. a single bond); preferably $C_3F_6$;

x is 1-10;

$R_3$ is a linear or branched alkyl group which is partially or completely halogenated or an aromatic or heteroaromatic group;

$R_2$ is a divalent aromatic group, including the structure:

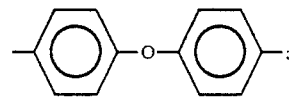

Ar = is a trivalent aromatic group, including the structure:

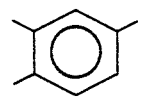

In the case of 6FPDA-ODA, $R_2$ is:

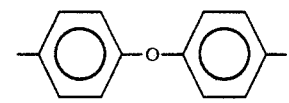

the $R_1$ group is hexafluoropropyl ($C_3F_6$) and crosslinking is presumed to be the result of $R_1$ conversion to a trifluoroethyl radical and accompanying loss of trifluoromethyl radicals. This process is analogous to the formation of nitric radicals discussed previously. Here, trifluoroethyl radicals on neighboring polyimide chains react producing an interchain crosslink network. This network raises the $T_g$ of the thermoplastic polyimide.

Thermal treatment of thermoplastic polyimides can also raise the $T_g$ of the respective polyimide by causing densification of the polymer matrix. Long thermal treatments result in densely packed and intertwined polymer chains promoted by slow rates of imidization and solvent removal. Therefore, a cure method capable of effecting imidization rapidly upon a more highly solvated and less closely spaced polymer can result in a more amorphous, less densely packed polyimide with enhanced thermal reflow properties (lower Tg).

Thus, a method of polyimide curing which minimizes thermal input to the polyimide while maximizing the rate of imidization and outgassing is highly desirable. A preferred cure process uses infrared wavelength photons to dramatically increase the rate of imidization. Thermal assistance is also provided to increase the rate of polymer outgassing. The infrared wavelength chosen is determined from the N—H stretching band of the IR spectrum of the precursor polyamic acid. A wavelength chosen near the absorption maximum (N—H) is selected for maximum quantum yield of imidization. For most polyamic acids this absorbance band is located between 3540 cm$^{-1}$ to 3050cm$^{-1}$ (2.82-3.28 μm) in the electromagnetic spectrum and this range is preferred for curing 6FPDA-ODA. The wavelength or wavelength range selected may fall outside the preferred range depending upon the absorption characteristics of the polyamic acid being imidized and upon the emission characteristics of the exposure system. At the wavelength or within the wavelength range of exposure it is preferred that there be little or no additional absorbance by the polyimide which may give rise to crosslinking reactions. That is, those wavelengths capable of initiating bridging group ($R_1$) crosslinking reactions preferably should be excluded from the exposure radiation. The temperature of the film should be kept low since increased temperatures will promote ($R_1$), group crosslinking due principally to thermal energy which will occur with the imidization of the thermoplastic polyimide precursor. This temperature should be as low as possible, however, sufficiently high to facilitate outgassing. e.g. not above about 250° C.

Thus, by utilizing IR in the curing process, it is possible to quickly imidize both polyimides to a substantial extent without significant crosslinking or densification. This is important, especially with respect to the thermoplastic polyimide since as crosslinking and/or densification progresses, the $T_g$ of the thermoplastic polyimide rises, and in the subsequent lamination process it is necessary to heat the thermoplastic polyimide to above the $T_g$ to effect bonding of the metal foil to the polyimide and for several reasons it is desirable to bond at as a low a temperature as possible. Hence, by avoiding any substantial crosslinking or densification at this stage of the process, the bonding can be accomplished at a low temperature.

After about 4 minutes of exposure to the IR radiation at 250° C. for the above noted film thickness, both the polyimides PMDA-ODA and 6FPDA-ODA are essentially fully imidized. However, because of the relatively low temperature (250° C.) and the relatively short period of time (4 minutes), no substantial crosslinking of the polyimides occurs.

Following the IR cure the layer of copper foil which in the preferred embodiment is a beryllium-copper alloy, such as Alloy 3 which is sold by Brush Wellman having a place of business at 17876 St. Clair Avenue, Cleveland, Ohio 44110, is then laminated to the thermoplastic polyimide layer. The copper alloy foil may have an applicable surface texturing treatment to improve adhesion characteristics such as those imparted by the JTC treatment performed by Gould Inc., Foil Division, having a place of business in Eastlake, Ohio 44094. This surface texturing treatment is the result of electrochemical deposition of Cu onto the to-be-bonded Be/Cu surface. The preferred treatment provides a surface layer which is dendritic in nature, with these dendrites providing increased surface area and texture for interlock with the thermoplastic polyimide. It is preferred that the heights of these dendrites not exceed the thickness of the thermoplastic polyimide layer.

A stack comprised of the stainless steel with the polyimides bonded thereto is placed in a laminating press and the copper foil is placed over the thermoplastic polyimide and the pressure is raised to about 10 psi. Any conventional laminating press can be employed. One particularly appropriate press is a Model MTP-24 press manufactured by Tetrahedron Associates, Inc. having a place of business at 5060 Convoy Street, San Diego, California 92111, which is a press having 24"×24" platens.

As shown in FIG. 1, the temperature is then raised during a period of about 40 minutes to about 340° C. During this step in the processing, any gas that is trapped in the polyimides or which is formed by virtue of this heating up to 340° C. will be driven to the interface of the copper foil and the thermoplastic polyimide. Since the pressure is relatively low, i.e. about 10 psi, the gas can escape at the interface and not be trapped thereat. A vacuum may be applied during this step in the process to aid in degassing. After about 40 minutes when the heat has been elevated to about 340° C., essentially all of the trapped and formed gas has been outgassed.

At this point, both of the polyimide structures have crosslinked to some extent internally and at their interface. But the $T_g$ of the thermoplastic is still relatively low and it will still flow well for bonding at temperatures well below 400° C. The pressure is then ramped up quickly to about 675 psi and the temperature is concurrently raised to about 360° C.

As indicated above, because of the very rapid initial imidization of the two polyimides at low temperature of 250° for 4 minutes which did not produce any substantial crosslinking or densification, the temperature transit from ambient to 340° results in a structure in which the thermoplastic layer of polyimide has a $T_g$ substantially less than 360° C. since only a small amount of crosslinking occurs during the temperature transit to 340° C. Thus, when the temperature is raised to 360° C., which is well above the $T_g$ of the thermoplastic polyimide and a high pressure of 675 psi is applied concurrently, the thermoplastic polyimide will flow sufficiently to form a strong substantially continuous bond between the copper alloy foil and the thermoplastic polyimide. Also, during both heating steps, some crosslinking and chain entanglement occurs between the intractable polyimide and the thermoplastic polyimide at their mutual interface. This crosslinking and chain entanglement aids in the formation of a strong intractable polyimide/thermoplastic polyimide interface. From the standpoint of mechanical peel and adhesion performance, the finished laminate behaves as a single layer of polyimide bonded to stainless steel substrate on one side and copper alloy foil on the other.

The temperature and pressure are maintained at these elevated values for 30–45 minutes at which time the temperature is gradually reduced to below about 50° C. at which time the pressure will be reduced and removed. The heating at 360° C. for 30–45 minutes will cause further crosslinking and densification of the polyimides to continue, forming solid polyimide having good structural and dielectric properties.

Figure 2:
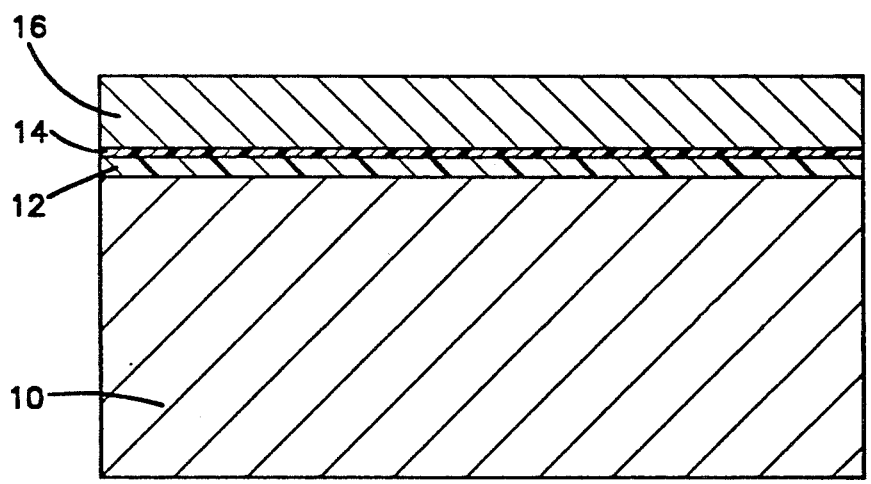

The end product formed by the above described process has a configuration as shown in FIG. 2. The structure includes a base of stainless steel 10, a layer of intractable polyimide 12 bonded thereto, a layer of thermoplastic polyimide 14 bonded to and crosslinked with the polyimide 12, and a beryllium copper alloy foil 16 mechanically bonded to the thermoplastic polyimide 14.

It has been found that a structure laminated according to this process has a very high bond strength in the critical copper to polyimide bond which was formed by the lamination step. Indeed, the adhesion of the copper foil to the polyimide consistently exceeds 4 pounds per inch as measured by a standard 90° peel test. Further, no macroscopic nonbonded areas where there is adhesion loss due to entrapped gases were found as compared to their presence in a significant number of cases when the prior techniques of imidizing and lamination were utilized.

As indicated above the present lamination process is not limited to the specific materials and specific temperatures and pressures described. This process can be used in any cases where a layer of intractable polyimide is bonded to a substrate and a layer of thermoplastic polyimide is applied over the intractable polyimide and a metal foil or metal sheet is laminated to the thermoplastic polyimide. In even broader aspects, this bonding technique can be used when a layer of thermoplastic polyimide is applied directly to a substrate (without the use of an intractable polyimide layer). The significant features are that the thermoplastic polyimide must be cured sufficiently rapidly to cause substantial imidization without any substantial crosslinking or densification and thereafter lamination takes place beginning at a low pressure and a temperature ramped upwardly to cause essentially complete outgassing, followed by an increase in pressure and at a temperature above the $T_g$ of the thermoplastic to cause laminar bonding.

While several embodiments of the present invention have been shown and described various adaptations and modifications can be made without departing from the scope of the invention as defined in the appended claims.

What is claimed is:

1. A method of laminating a metal sheet to a polyimide material comprising the steps of:
   applying a solution of a precursor of an intractable polyimide to a substrate, and removing the solvent to form a dry tack-free first film;
   applying a solution of a precursor of a thermoplastic polyimide material to said first film and removing the solvent to form a dry tack-free second film;
   curing both films sufficiently rapidly to effect substantial imidization of each film without substantial crosslinking or densification of either of the polyimide films internally;
   thereafter laminating a metal sheet onto said thermoplastic polyimide according to the following process:
   (a) contacting the imidized thermoplastic polyimide with a sheet of metal to be laminated thereto;
   (b) applying a first pressure to said sheet of metal and said polyimide substrate composite which is sufficiently low to permit outgassing of any gas trapped or generated within said polyimides;
   (c) increasing the temperature of the polyimides while maintaining said first pressure to thereby essentially completely imidize said polyimides and expel gases contained in said polyimides;
   (d) increasing the pressure to a second pressure value and heating to a temperature which is above the $T_g$ of said thermoplastic polyimide to complete lamination of the metal to the polyimide; and
   (e) thereafter cooling to ambient and removing the pressure.

2. The method as defined in claim 1 wherein the cure of the polyimide to effect substantial imidization includes the use of infrared energy.

3. The method as defined in claim 1 wherein said metal sheet is a copper alloy.

4. The method as defined in claim 3 wherein the copper alloy is beryllium copper.

5. The method as defined in claim 1 wherein said temperature is raised to a second value when said pressure is raised to said second value.

6. The method as defined in claim 1 wherein said substrate is a steel alloy.

7. The method as defined in claim 2 wherein said cure which includes infrared energy is performed at a temperature sufficiently low to prevent any substantial crosslinking or densification of the thermoplastic polyimide, with said infrared energy including radiation in the band width of 2.82 to 3.28 microns.

8. The method as defined in claim 7 wherein said cure temperature does not exceed about 250° C.

9. The method as defined in claim 2 wherein said first pressure is not greater than about 10 psi and the temperature is increased while at said first pressure to about 340° C.

10. The method as defined in claim 9 wherein the second pressure value is about 675 psi.

11. The method as defined in claim 10 wherein the temperature is raised to about 360° C. during the time the second pressure is applied.

12. The method as defined in claim 1 wherein the thermoplastic polyimide precursor has the structure:

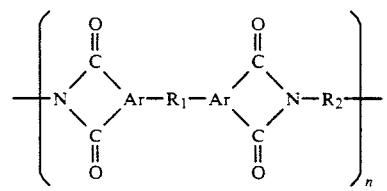

where

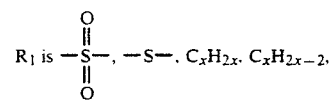

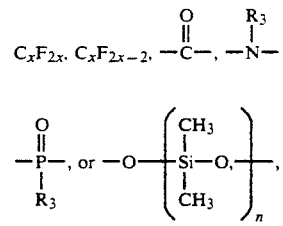

or
—(i.e. a single bond);
x is 1–10
$R_3$ = is a linear or branched alkyl group which is partially or completely halogenated or an aromatic or heteroaromatic group;
$R_2$ = is a divalent aromatic group;
Ar = is a trivalent aromatic group.

13. The method in claim 12 wherein:
$R_1$ is: $C_3F_6$;
$R_2$ is;

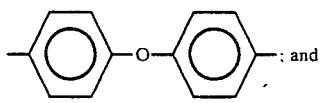 ; and

Ar is:

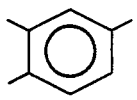

14. The method as defined in claim 1 wherein a vacuum is applied during at least a portion of step (c).

15. A method of laminating a metal sheet to a polyimide material comprising the steps of:
applying a solution of a precursor of a thermoplastic polyimide material to a substrate and removing the solvent to form a dry tack-free film;
curing said film sufficiently rapidly to effect substantial imidization of said film without substantial crosslinking or densification of the film internally;
thereafter laminating a metal sheet onto said thermoplastic polyimide film according to the following process:
(a) contacting the imidized thermoplastic polyimide with a sheet of metal to be laminated thereto;
(b) applying a first pressure to said sheet of metal and said polyimide substrate composite which is sufficiently low to permit outgassing of any gas trapped or generated within said polyimide;
(c) increasing the temperature of the polyimide while maintaining said first pressure to thereby essentially completely imidize said polyimide and expel gases contained in said polyimide;
(d) increasing the pressure to a second pressure value and heating to a temperature which is above the $T_g$ of said polyimide to complete lamination of the metal to the polyimide; and
(e) thereafter cooling to ambient and removing the pressure.

16. The method as defined in claim 15 wherein the cure of the polyimide to effect substantial imidization includes the use of infrared energy.

17. The method as defined in claim 15 wherein said metal sheet is a copper alloy.

18. The method as defined in claim 17 wherein the copper alloy is beryllium copper.

19. The method as defined in claim 15 wherein said temperature is raised to a second value when said pressure is raised to said second value.

20. The method as defined in claim 15 wherein said substrate is a steel alloy.

21. The method as defined in claim 16 wherein said cure which includes infrared energy is performed at a temperature sufficiently low to prevent any substantial crosslinking or densification of the polyimide, with said infrared energy including radiation in the band width of 2.82 to 3.28 microns.

22. The method as defined in claim 21 wherein said cure temperature does not exceed about 250° C.

23. The method as defined in claim 22 wherein said first pressure is not greater than about 10 psi and the temperature is increased while at said first pressure to about 340° C.

24. The method as defined in claim 23 wherein the second pressure value is about 675 psi.

25. The method as defined in claim 24 wherein the temperature is raised to about 360° C. during the time the second pressure is applied.

26. The method as defined in claim 15 wherein the polyimide has the structure:

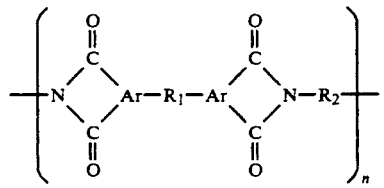

where

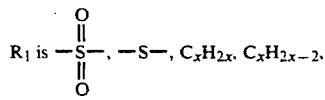

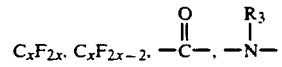

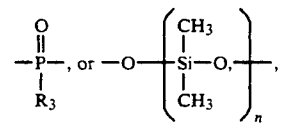

or
—(i.e. a single bond);
x is 1-10
$R_3$ is a linear or branched alkyl group which is partially or completely halogenated or an aromatic or heteroamatic group;
$R_2$ is a divalent aromatic group;
Ar is a trivalent aromatic group.

27. The method in claim 26 wherein:
$R_1$ is: $C_3F_6$;
$R_2$ is:

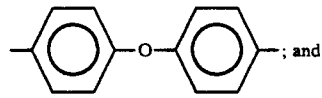 ; and

Ar is:

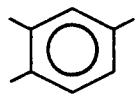

28. The method as defined in claim 15 wherein a vacuum is applied during at least a portion of step (c).

* * * * *